United States Patent
Bertsche et al.

(10) Patent No.: US 7,253,410 B1
(45) Date of Patent: Aug. 7, 2007

(54) CHARGE-CONTROL PRE-SCANNING FOR E-BEAM IMAGING

(75) Inventors: Kirk J. Bertsche, San Jose, CA (US); John Greene, Santa Cruz, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 84 days.

(21) Appl. No.: 11/225,917

(22) Filed: Sep. 13, 2005

Related U.S. Application Data

(60) Provisional application No. 60/662,461, filed on Mar. 16, 2005.

(51) Int. Cl.
*H01J 37/244* (2006.01)

(52) U.S. Cl. .................. 250/310; 250/396 R; 250/397; 250/307; 438/18; 438/14; 324/751; 324/750

(58) Field of Classification Search ..................... None
See application file for complete search history.

(56) References Cited

U.S. PATENT DOCUMENTS

| | | | |
|---|---|---|---|
| 3,458,752 A | 7/1969 | Stowell | |
| 4,415,851 A | 11/1983 | Langner et al. | |
| 5,045,705 A | 9/1991 | Mollenstedt | |
| 5,432,345 A | 7/1995 | Kelly | |
| 5,973,323 A | 10/1999 | Adler et al. | |
| 5,986,263 A | 11/1999 | Hiroi et al. | |
| 5,990,476 A | 11/1999 | Larson et al. | |
| 6,066,849 A * | 5/2000 | Masnaghetti et al. | ....... 250/310 |
| 6,232,787 B1 | 5/2001 | Lo et al. | |
| 6,252,412 B1 | 6/2001 | Talbot et al. | |
| 6,344,750 B1 | 2/2002 | Lo et al. | |
| 6,465,781 B1 | 10/2002 | Nishimura et al. | |
| 6,580,075 B2 * | 6/2003 | Kametani et al. | ........... 250/310 |
| 6,586,736 B1 * | 7/2003 | McCord | ..................... 250/310 |
| 6,734,429 B2 | 5/2004 | Takagi | |
| 6,765,205 B2 | 7/2004 | Ochiai et al. | |
| 6,828,571 B1 | 12/2004 | McCord et al. | |
| 6,930,309 B1 | 8/2005 | Mankos et al. | |
| 2002/0130260 A1 | 9/2002 | McCord et al. | |
| 2003/0141451 A1 | 7/2003 | Sato et al. | |
| 2005/0023486 A1 | 2/2005 | Takakuwa et al. | |

OTHER PUBLICATIONS

McCord, M.A. "Use of Ultraviolet Light in charged Particle Systems to Reduce Charging and Contamination", IBM Technical Disclosure Bulletin, Pub No. 10a, Mar. 1990, pp. 157-158, Yorktown, U.S.A.

* cited by examiner

*Primary Examiner*—Jack I. Berman
*Assistant Examiner*—Zia R. Hashmi
(74) *Attorney, Agent, or Firm*—Okamoto & Benedicto LLP

(57) ABSTRACT

One embodiment described relates to a method of electron beam imaging of a target area of a substrate. An electron beam column is configured for charge-control pre-scanning using a primary electron beam. A pre-scan is performed over the target area. The electron beam column is re-configured for imaging using the primary electron beam. An imaging scan is then performed over the target area. Other embodiments are also described.

18 Claims, 5 Drawing Sheets

CHARGE-CONTROL PRE-SCANNING FOR E-BEAM IMAGING

CROSS-REFERENCE TO RELATED APPLICATION

The present application claims the benefit of U.S. provisional patent application No. 60/662,461, entitled "Charge-control pre-scanning for e-beam imaging," filed Mar. 16, 2005 by Kirk J. Bertsche and John Greene, the disclosure of which is hereby incorporated by reference in its entirety.

BACKGROUND OF THE INVENTION

1. Field of the Invention

The present invention relates generally to electron beam imaging apparatus and methods of using same.

2. Description of the Background Art

Automated inspection and review systems are important in process control and yield management for the semiconductor and related microelectronics industries. Such systems include optical and electron beam (e-beam) based systems.

In the manufacture of semiconductor devices, detection of physical defects and electrical failure earlier in the fabrication process is becoming increasingly important to shorten product development cycles and increase product yield and productivity. Advanced wafer inspection systems based on scanning electron microscopy technology have been used to detect defects and electrical failure as voltage contrast defects. However, as device design rules further shrink, and new processes (such as, for example, high aspect ratio (HAR) contacts in front-end-of-line (FEOL), HAR vias in back-end-of-line (BEOL), and dual damascene copper processes) are being widely implemented, it becomes more challenging to detect defects in device structures with smaller design rules and higher aspect ratios. Further, image contrast variation caused by uneven charge distribution can make e-beam inspection unstable or un-inspectable. Such contrast variation can occur from inside a die, from die to die, row to row, or wafer to wafer. In order to successfully inspect a wafer, control of surface charge is advantageous to 1) detect defects effectively, and 2) reduce image contrast variation during inspection.

In a conventional scanning electron microscope, a beam of electrons is scanned over a sample (for example, a semiconductor wafer). Multiple raster scans are typically performed over an area of the sample. The beam of electrons either interact with the sample and cause an emission of secondary electrons, bounce off the sample as backscattered electrons, or are absorbed by the sample. The secondary electrons and/or backscattered electrons are then detected by a detector that is coupled with a computer system. The computer system generates an image that is stored and/or displayed on the computer system.

Typically a certain amount of charge is required to provide a satisfactory image. This quantity of charge helps enhance the contrast features of the sample. Although conventional electron microscopy systems and techniques typically produce images having an adequate level of quality under some conditions, they produce poor quality images of the sample for some applications.

For example, on a sample made of a substantially insulative material (e.g., silicon dioxide), performing one or more scans over a small area causes the sample to accumulate excess positive or negative charge in the small area relative to the rest of the sample. The excess of positive charge generates a potential barrier for some of the secondary electrons, and this potential barrier inhibits some of the secondary electrons from reaching the detector. Since this excess positive charge is likely to cause a significantly smaller amount of secondary electrons to reach the detector, an image of the small area is likely to appear dark, thus obscuring image features within that small area. Alternatively, excess negative charge build up on the sample can increase the collection of secondary electrons causing the image to saturate. In some cases, a small amount of charging is desirable since it can enhance certain image features (by way of voltage contrast) as long as it does not cause image saturation.

The excess charge remaining from a previous viewing or processing may therefore cause distortion. One solution used in SEM devices is to flood the sample with charged particles from a separate flood gun at a time separate from the inspection. The flooding beam is typically separate from the main inspection column of the e-beam inspection system, though in some instances the flooding beam may be implemented in the main inspection column. The intent of using such flooding is to equalize the charge appearing across the sample, thus improving contrast uniformity of the images. However, while flooding may equalize longer time scale charging effects, shorter time scale charge decay between the flooding and the imaging times may still cause undesirable charging distortion.

Some conventional systems average together multiple scans of a wafer surface to create an image for inspection. However, such averaging merely uses statistics to "hide" the undesirable effects of charging in the image.

FIG. 1 is a schematic diagram of a conventional electron beam imaging apparatus with a separate flood gun for charge control. As shown, the apparatus includes a primary (imaging) column 102. The column 102 includes an electron gun 104 that is the source of electrons for the primary (imaging) electron beam 106. Condensing lenses 108 condense the beam 106 into a tighter cross-section (and higher density). The beam 106 is controllably deflected using scanning coils 110 so as to scan the beam across the desired area. An objective lens 112 focuses the beam onto the wafer 114. A detector 116 is arranged to detect secondary electrons (and/or backscattered electrons). Electronics connected to the detector 116 is used to store the detected data so as to be able to form useful images for processing and analysis.

As further shown in FIG. 1, an electron beam flood gun 118 may be arranged so as to emit a flooding electron beam 120 over the sample 114. The use of this flood beam 120 to control charging is discussed below in relation to FIG. 2.

FIG. 2 is a flow chart of a conventional method of pre-flooding with a separate e-beam 120 and subsequently imaging the wafer 114 with a primary e-beam 106. In this conventional technique, before imaging, the wafer 114 is flooded 202 with electrons using the separate flooding e-beam 120. This flooding 202 is applied for a period of time sufficient to control a charge level at the wafer 114. Thereafter, the electron flooding 202 of the wafer 114 is stopped 204, and the imaging of the wafer 114 is subsequently begun. The primary e-beam 106 is scanned 206 across the wafer 114, and scattered (secondary and/or backscattered) electrons are detected 208. An image is formed 210 from the detected data. In some cases, several scans 206 may be used and the data may be averaged.

It is desirable to improve e-beam inspection and review apparatus. In particular, it is desirable to better control effects of charging and discharging on images used for inspection and review.

SUMMARY

One embodiment of the invention pertains to a method of electron beam imaging of a target area of a substrate. An electron beam column is configured for charge-control pre-scanning using a primary electron beam. A pre-scan is performed over the target area. The electron beam column is re-configured for imaging using the primary electron beam. An imaging scan is then performed over the target area.

Another embodiment pertains to an apparatus with an electron beam column for imaging a target area of a substrate. The apparatus includes at least an electron source, condensing lenses, scanning deflectors, an objective lens, a detector, and a controller. The electron source is configured to generate electrons for an electron beam, and the condensing lenses is configured to condense the electron beam into a tighter cross-section. The scanning deflectors are configured to deflect the electron beam over the target area, and the objective lens is configured to focus the electron beam onto the target area. the detector is configured to detect scattered electrons. The controller is programmed to sequentially i) configure the column for charge-control pre-scanning using the electron beam, ii) perform pre-scanning over the target area, iii) re-configure the column for imaging using the electron beam, and iv) perform image scanning over the target area.

Other embodiments are also described.

DETAILED DESCRIPTION

As discussed above, uncontrolled charging and discharging of insulating samples, such as patterned oxide wafers, may cause undesirable electron image distortions. Applicants have noted that charging and discharging of insulating samples occurs at a number of time scales. While flooding with a separate electron flood beam may control longer time-scale charging effects, the time interval between the flooding and the imaging leaves room for shorter time-scale charging or discharging to occur. Such uncontrolled charging or discharging may result in undesirable image distortions.

The present application discloses a technique of charge-control pre-scanning for electron beam (e-beam) imaging. The technique advantageously controls charging on the insulating sample on a short time scale immediately before the imaging.

Figure 1:
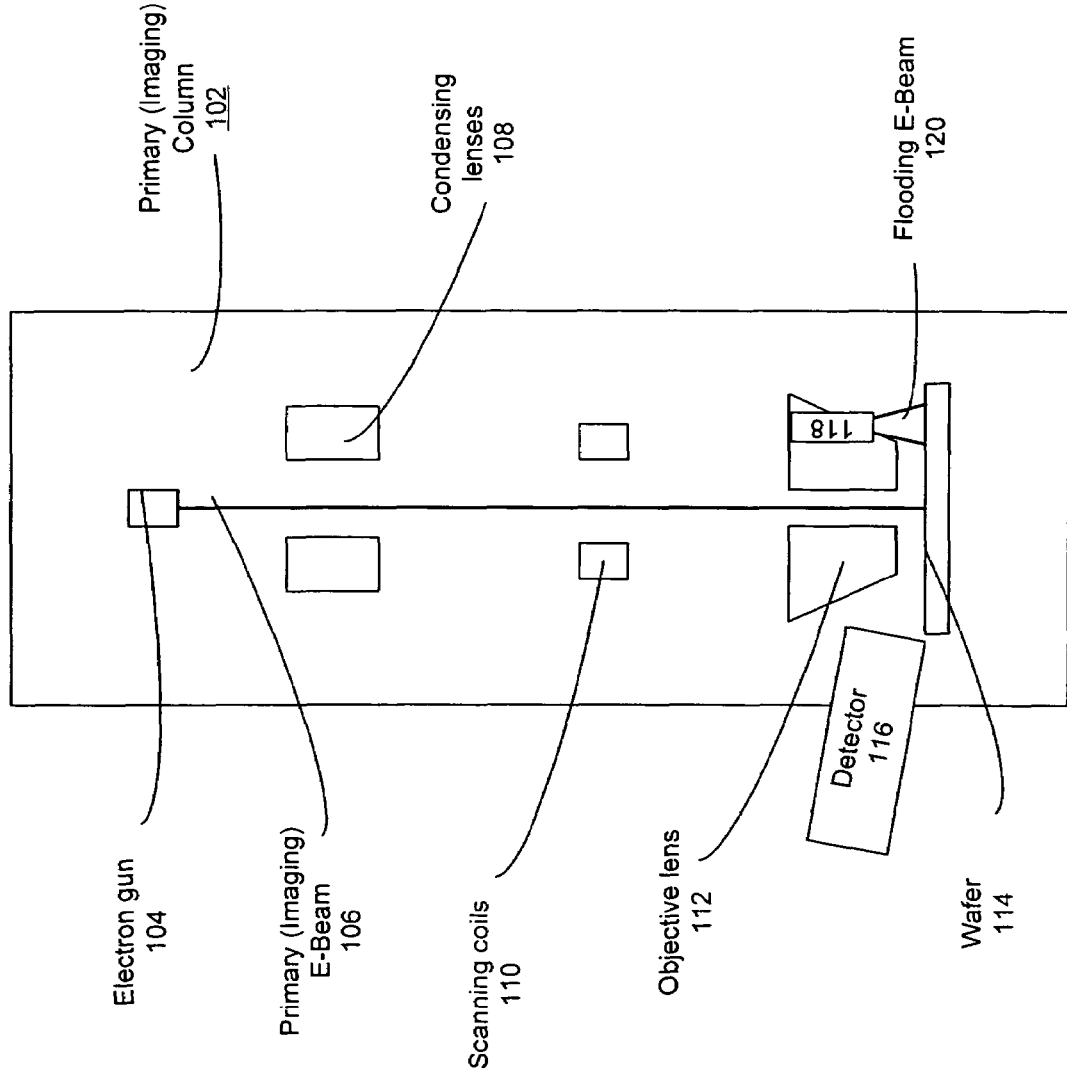
FIG. 1 is a schematic diagram of a conventional electron beam imaging apparatus with a separate flood gun for charge control.
Figure 2:
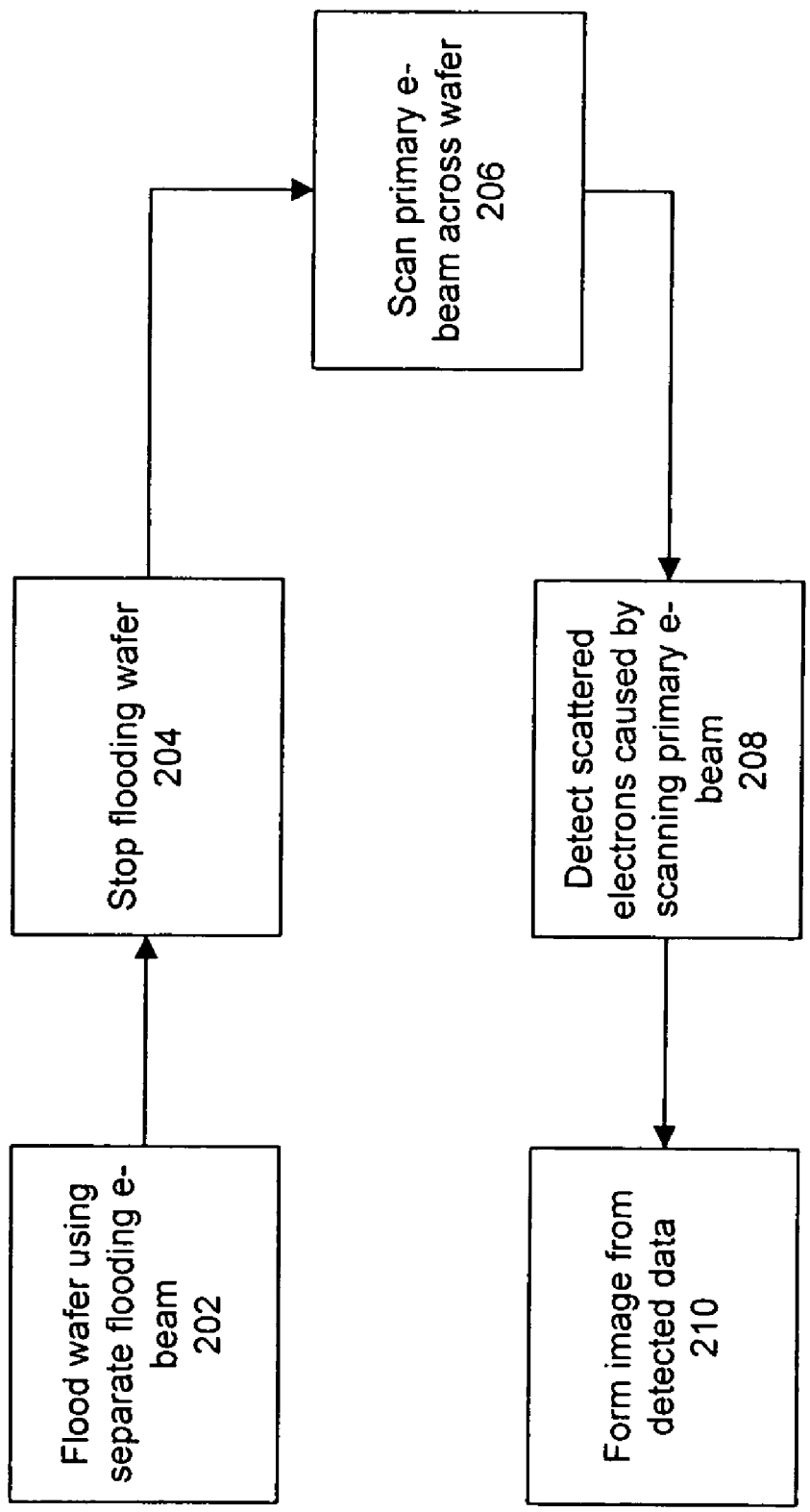
FIG. 2 is a flow chart of a conventional method of pre-flooding with a separate e-beam and subsequently imaging the wafer with a primary e-beam.
Figure 3:
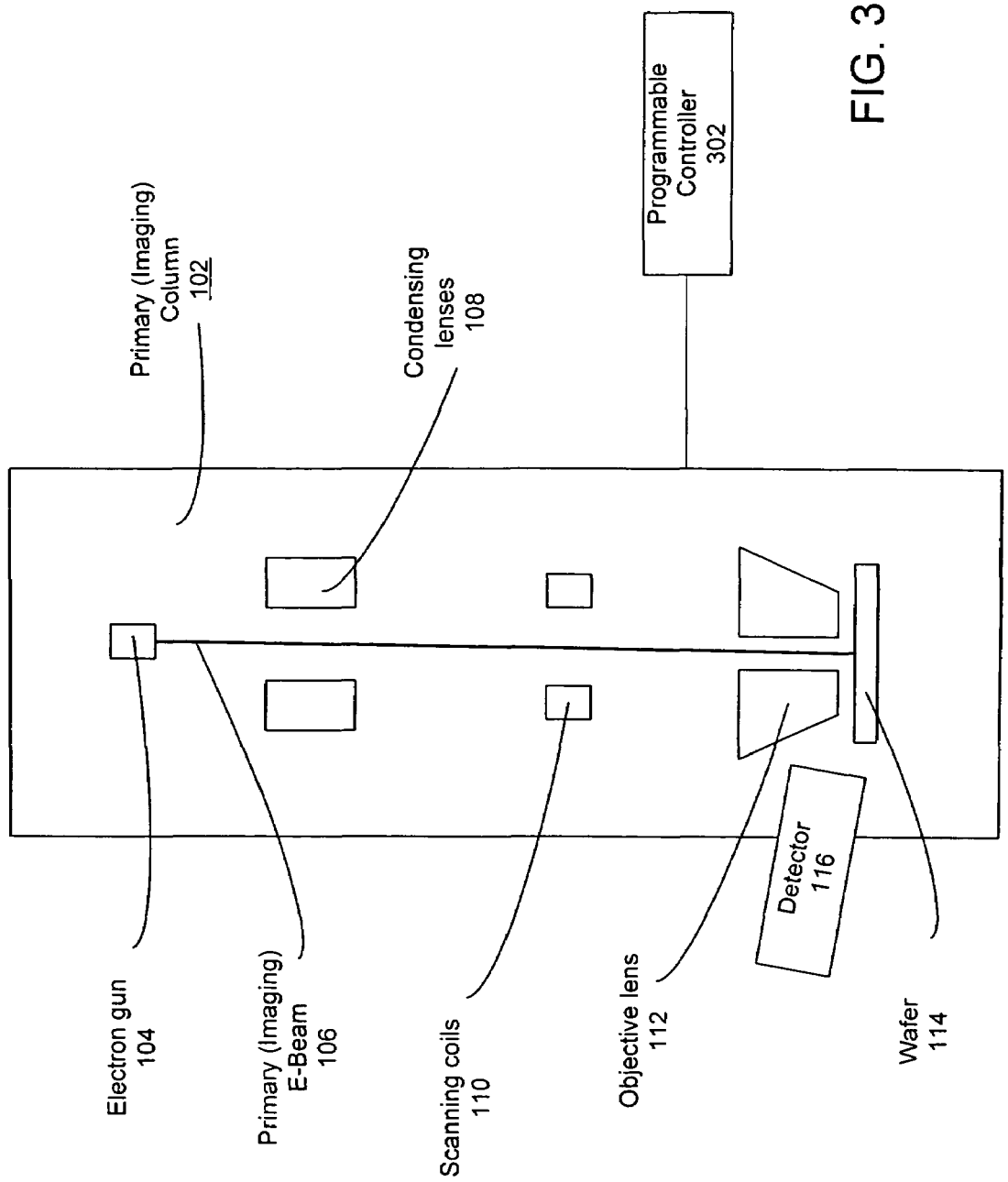
FIG. 3 is a schematic diagram of an electron beam imaging apparatus without a separate flood gun for charge control.

FIG. 3 is a schematic diagram of an electron beam imaging apparatus without a separate flood gun for charge control. FIG. 3 shows the same apparatus components as FIG. 1, except for the separate flood gun 116 and its flood beam 118. As discussed further below, the present application discloses a technique for charge control that does not require such a flood gun 116. Moreover, the disclosed technique is advantageous in that it is capable of controlling charge on a shorter time-scale and with finer spatial control.

In addition, a programmable controller 302 is shown in FIG. 3. The programmable controller 302 is configured to programmably control various aspects of the electron beam column 102. For example, the controller 302 may be programmed to implement methods of charge-control pre-scanning for e-beam imaging as discussed further below.

Figure 4:
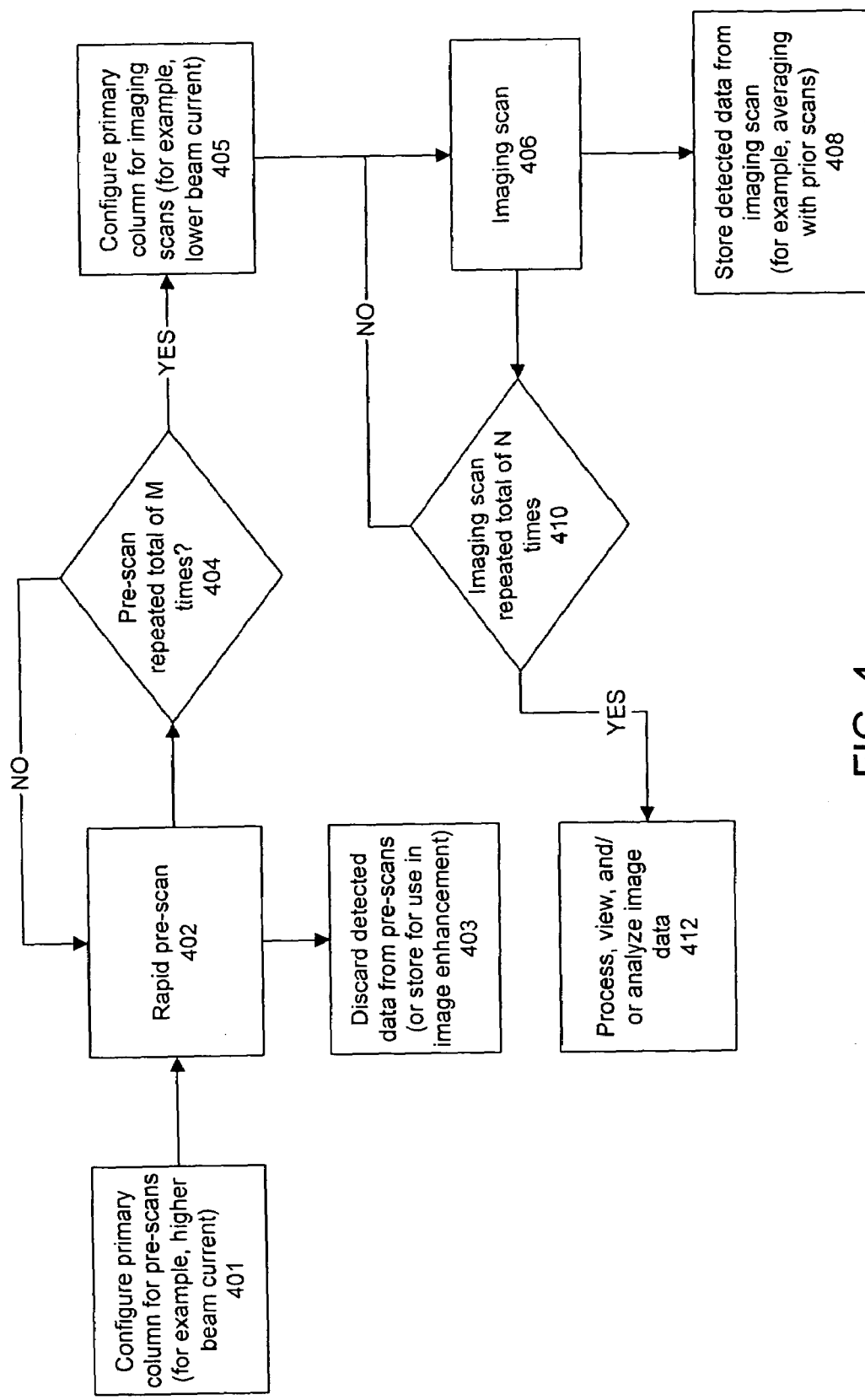
FIG. 4 is a flow chart of a method of charge-control pre-scanning for e-beam imaging in accordance with an embodiment of the present invention.

FIG. 4 is a flow chart of a method of charge-control pre-scanning for e-beam imaging in accordance with an embodiment of the present invention. In this technique, charge control is achieved using the primary (imaging) electron beam column 102.

First, the column 102 is configured 401 for the charge-control "pre-scanning." For example, in one embodiment, the column 102 configuration may be changed to provide a higher beam current in the pre-scanning than would be used for imaging. One way to change the beam current is discussed below in relation to FIG. 5. Other ways to increase the beam current may also be used. In other embodiments, configuring 401 the column 102 for the charge-control pre-scanning may involve aspects other than beam current. For example, the spot size of the pre-scanning beam may be increased compared to the imaging beam. Changing the spot size may be accomplished, for example, using electrostatic or magnetic lenses in the column 102. In another example, the landing energy of the pre-scanning beam may be changed compared to the imaging beam. Changing the landing energy may be accomplished, for example, by changing a voltage on the stage holding the sample. Depending on the specific system and the specific implementation of the present invention, the configuration for the pre-scanning beam may be changed in various other ways compared with the configuration for the imaging beam. However, changing magnetic lens currents to change the landing energy is typically less practical, because Eddy current settling times are too long to make rapid changes to magnetic lens fields.

One or more rapid "pre-scans" are then performed 402 using the primary column 102. In one embodiment of the invention (as illustrated in FIG. 4), since these pre-scans are performed for charge control purposes, the detected data from the pre-scans may be discarded 403 and not used. In other embodiments, data from the pre-scans may be substracted from or otherwise combined with the imaging data to provide an enhancement to the imaging data.

In accordance with an embodiment of the invention, the apparatus is programmed so as to repeat the pre-scanning a total of M times (performed M times in a row), where M is a programmable number. Hence, a determination 404 may be made after each pre-scan 402 whether or not the pre-scan has been repeated a total of M times. Once the pre-scan has been repeated a total of M times, then the method moves on so as to perform the imaging.

After the pre-scanning is completed, the column 102 is re-configured 405 for the imaging scanning. For example, in one embodiment, the column 102 configuration may be changed to provide a lower beam current in the imaging than would be used for pre-scanning. In other embodiments, re-configuring 405 the column 102 for the image scanning may involve aspects other than beam current. For example, the spot size of the imaging beam may be decreased compared to the pre-scanning beam. In another example, the landing energy of the imaging beam may be changed compared to the pre-scanning beam. Depending on the specific system and the specific implementation of the present invention, the configuration for the imaging beam may be changed in various other ways compared with the configuration for the pre-scanning beam.

Preferably, such re-configuration 405 of the primary column 102 is performed rapidly so as to result in a short time interval between the end of the pre-scanning and the beginning of the image scanning. Because the primary column 102 may configured under electronic control, such reconfiguration 405 may be accomplished in sub-second times. This may be advantageously used to prevent short time-scale charging and/or discharging effects from occurring between the pre-scanning and the image scanning.

One or more imaging scans are then performed 406 using the primary column 102. Since these imaging scans are performed to collect electron image data, the detected data from the imaging scans are stored 408 by the apparatus. In one embodiment, for example, the data from one image scan may be averaged with preceding image scans of the same area. In another embodiment, the data from each image scan may be stored separately for flexibility in subsequent processing.

In accordance with an embodiment of the invention, the apparatus is programmed so as to repeat the image scanning a total of N times (performed N times in a row), where N is a programmable number. Hence, a determination 410 may be made after each imaging scan 406 whether or not the imaging scan 406 has been repeated a total of N times. Once the imaging scan 406 has been repeated a total of N times, then the stored image data may be further processed, viewed, and analyzed 412.

Embodiments of the present invention may apply the method of FIG. 4 to different areas of a semiconductor wafer or other substrate. In one embodiment, the method may be applied such that each scan in the pre-scan/scan cycle of FIG. 4 covers substantially an entire wafer area. In another embodiment, each scan in the pre-scan/scan cycle of FIG. 4 may cover only a small portion of a wafer, for example, a single die, or a smaller target area having features of interest. In yet another embodiment, each scan in the pre-scan/scan cycle of FIG. 4 may cover a single scan line, or a group of scan lines.

Figure 5:
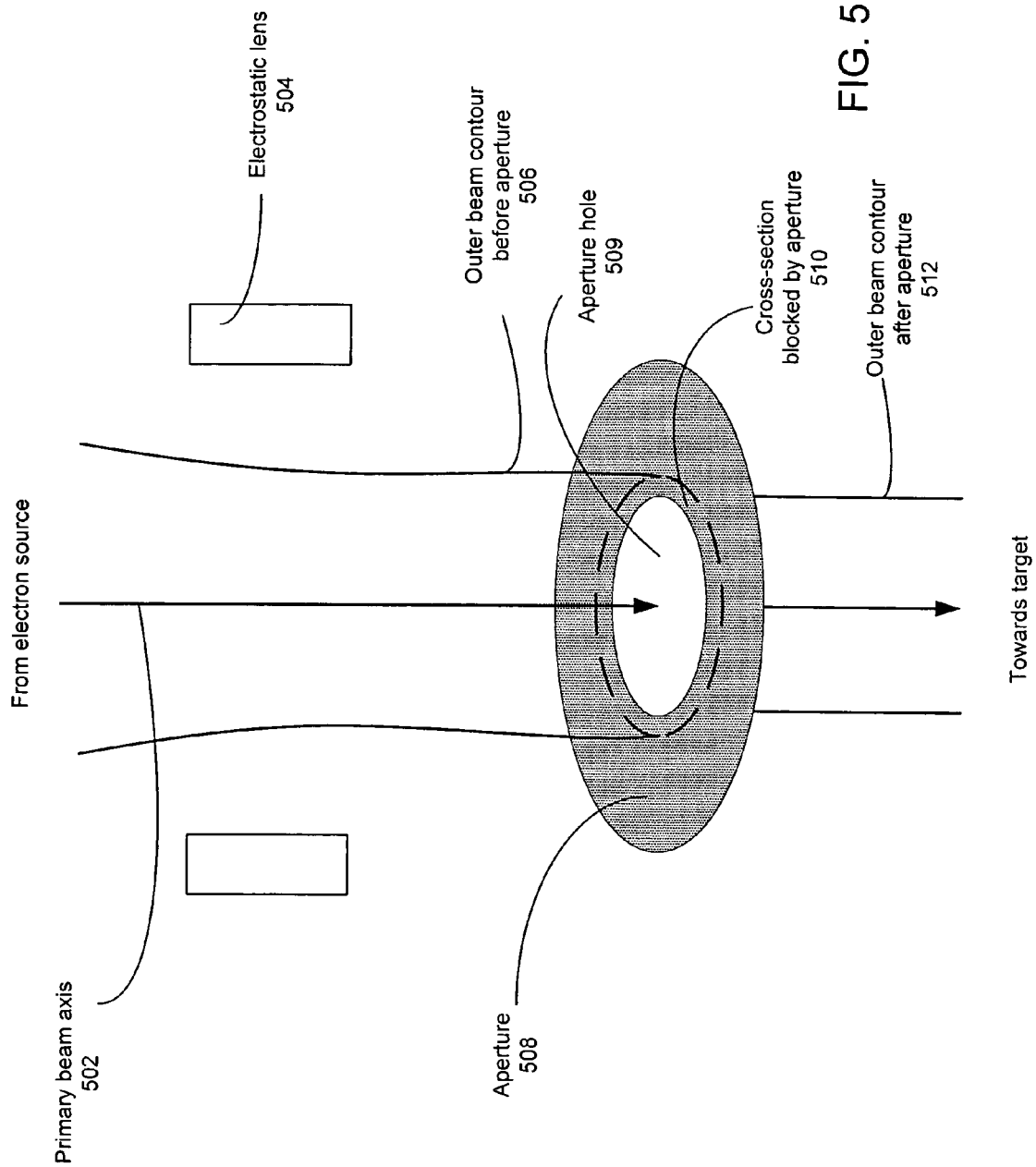
FIG. 5 is a schematic diagram of a beam current control apparatus in accordance with an embodiment of the invention.

FIG. 5 is a schematic diagram of a beam current control apparatus in accordance with an embodiment of the invention. The beam current control apparatus may comprise an aperture 508 with a hole 509 aligned along the primary beam axis 502 of the column 102. Going from the top of FIG. 5, the electron beam travels from the electron source through an electrostatic lens 504. (This may be a condensing lens 108 of FIG. 3.) An outer beam contour 506 of the beam before the aperture is depicted. As shown, the outer beam contour 506 impinges upon an opaque portion of the aperture 508 such that an annular cross-section 510 of the beam is blocked by the aperture 508. After the aperture 508, as the beam travels down the column in the direction towards the target, an outer beam contour 512 is depicted that corresponds to the portion of the beam passing through the hole 509 of the aperture 508.

In accordance with an embodiment of the invention, the strength of the electrostatic lens 504 may be increased in configuring 401 the column 102 for pre-scanning. Such an increase in lens strength would cause less beam current to be blocked by the aperture 508 and hence more beam current to land on the target during a pre-scan. In addition, it will tend to defocus the column resulting in an enlarged beam spot size. Conversely, the strength of the electrostatic lens 504 may be decreased in re-configuring 405 the column 102 for imaging. Such a decrease in lens strength would cause more beam current to be blocked by the aperture 508 and hence less beam current to land on the target during an imaging scan. In other embodiments of the invention, alternate apparatus may be used to change the beam current between pre-scans and imaging scans.

The above-described diagrams are not necessarily to scale and are intended be illustrative and not limiting to a particular implementation. The above-described invention may be used, for example, in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of electron beam imaging of a target area of a substrate, the method comprising:
   configuring an electron beam column for charge-control pre-scanning using a primary electron beam;
   repeatedly performing a pre-scan a programmable plurality of M times over the target area;
   re-configuring the electron beam column for imaging using the primary electron beam; and
   performing an imaging scan over the target area.

2. The method of claim 1, wherein configuring the column for charge-control pre-scanning comprises increasing a beam current, and wherein re-configuring the column for imaging comprises decreasing the beam current.

3. The method of claim 2, wherein the beam current is increased by increasing a beam portion passing through a beam aperture, and wherein the beam current is decreased by decreasing the beam portion passing through the beam aperture.

4. The method of claim 1, wherein configuring the column for charge-control pre-scanning comprises increasing a beam spot size, and wherein re-configuring the column for imaging comprises decreasing the beam spot size.

5. The method of claim 1, wherein configuring the column for charge-control pre-scanning comprises increasing a beam spot size, and wherein re-configuring the column for imaging comprises decreasing the beam spot size.

6. The method of claim 1, wherein the imaging scan is programmably repeated a total of N times over the target area.

7. The method of claim 6, wherein data detected from the imaging scans is averaged together.

8. The method of claim 1, wherein data detected from pre-scanning is discarded and not used.

9. The method of claim 1, wherein data detected from pre-scans is combined with data detected from imaging scans for image enhancement.

10. The method of claim 1, wherein the target area comprises substantially an entire wafer.

11. The method of claim 1, wherein the target area comprises a sub-area of a wafer.

12. The method of claim 1, wherein the target area comprises a single scan line.

13. The method of claim 1, wherein the target area comprises a group of scan lines.

14. The method of claim 1, wherein a same beam characteristics are used for the pre-scan and the imaging scan.

15. An apparatus with an electron beam column for imaging a target area of a substrate, the apparatus comprising:
    an electron source configured to generate electrons for an electron beam;
    condensing lenses configured to condense the electron beam into a tighter cross-section;
    scanning deflectors configured to deflect the electron beam over the target area;
    an objective lens for focusing the electron beam onto the target area;
    a detector configured to detect scattered electrons; and
    a controller programmed to sequentially i) configure the column for charge-control pre-scanning using the electron beam, ii) repeatedly perform pre-scanning a programmable plurality of M times over the target area, iii) re-configure the column for imaging using the electron beam, and iv) perform image scanning over the target area.

16. The apparatus of claim 15, further comprising a focusing lens and an aperture, wherein the column is configured for charge-control pre-scanning by at least increasing a strength of the focusing lens to increase a beam current passing through the aperture, and wherein the column is re-configured for imaging by at least decreasing the strength of the focusing lens to decrease the beam current passing through the aperture.

17. The apparatus of claim 15, wherein the imaging scanning is programmably repeated a total of N times over the target area.

18. A method of electron beam imaging of a substrate, the method comprising:
    configuring an electron beam column for charge-control pre-scanning using a primary electron beam;
    performing a pre-scan over a single scan line;
    re-configuring the electron beam column for imaging using the primary electron beam; and
    performing an imaging scan over the single scan line.

* * * * *